United States Patent [19]
Ahmad et al.

[11] Patent Number: 5,489,546
[45] Date of Patent: Feb. 6, 1996

[54] METHOD OF FORMING CMOS DEVICES USING INDEPENDENT THICKNESS SPACERS IN A SPLIT-POLYSILICON DRAM PROCESS

[75] Inventors: Aftab Ahmad; Pierre C. Fazan, both of Boise; Charles H. Dennison, Meridian, all of Id.

[73] Assignee: Micron Technology, Inc., Boise, Id.

[21] Appl. No.: 449,300

[22] Filed: May 24, 1995

[51] Int. Cl.⁶ .................................................. H01L 21/8242
[52] U.S. Cl. .................................. 437/57; 437/34; 437/48; 437/52; 437/56
[58] Field of Search .................................. 437/57, 48, 34, 437/43, 52, 56, 58, 59, 47

[56] References Cited

U.S. PATENT DOCUMENTS

| | | | |
|---|---|---|---|
| 5,021,353 | 6/1991 | Lowrey et al. | 437/34 |
| 5,026,657 | 6/1991 | Lee et al. | 437/47 |
| 5,030,585 | 7/1991 | Gonzalez et al. | 437/47 |
| 5,032,530 | 7/1991 | Lowrey et al. | 437/34 |
| 5,134,085 | 7/1992 | Gilgen et al. | 437/48 |
| 5,272,367 | 12/1993 | Dennison et al. | 257/306 |
| 5,366,918 | 11/1994 | Yang | 437/47 |

Primary Examiner—Tuan H. Nguyen
Attorney, Agent, or Firm—Hopkins, Roden, Crockett, Hansen & Hoopes

[57] ABSTRACT

NMOS and PMOS devices are formed in a split-polysilicon CMOS process using independent thickness transistor gate spacers, and using a silicon nitride layer as a mask for the p-channel region during an n+ source/drain implant step of the n-channel region. The p-channel spacer is formed significantly thicker than the n-channel spacer, thereby reducing lateral diffusion of p-type dopant species under the p-channel gate and avoiding short channel effects to improve device reliability and performance. P-channel transistor junction depth and lateral diffusion is further reduced by performing an n-channel arsenic source/drain implant before the p-channel source/drain boron difluoride implant, although the p-channel transistor gate is etched before the n-channel gate. Moreover, since the p-channel transistor gate is etched before the n-channel gate, the p-channel gate sidewalls are reoxidized as well as the n-channel gate sidewalls for improved gate oxide integrity.

16 Claims, 3 Drawing Sheets

METHOD OF FORMING CMOS DEVICES USING INDEPENDENT THICKNESS SPACERS IN A SPLIT-POLYSILICON DRAM PROCESS

TECHNICAL FIELD

This invention relates to semiconductor technology and, more specifically, to a process for creating CMOS devices.

BACKGROUND OF THE INVENTION

Most current-generation dynamic random access memories (DRAMs) utilize CMOS technology. Although the term "CMOS" is an acronym for (C)omplementary (M)etal (O)xide (S)emiconductor, the term CMOS is now loosely applied to any integrated circuit in which both n-channel and p-channel field-effect transistors (FETs) are used in a complementary fashion. Although CMOS integrated circuit devices are often referred to as semiconductor devices, such devices are fabricated from various materials which are either electrically conductive, electrically nonconductive, or electrically semiconductive.

Silicon is the most commonly used semiconductor material and is used in either single-crystal or polycrystalline form. Polycrystalline silicon is referred to hereinafter as "polysilicon" or simply as "poly". Silicon can be made conductive by doping it (introducing an impurity into the silicon crystal structure) with either an element having at least one less valence electron than silicon, such as boron, or with an element having at least one more valence electron than silicon, such as phosphorus or arsenic. In the case of boron doping, electron "holes" become the charge carders and the doped silicon is referred to as positive or p-type silicon. In the case of phosphorus or arsenic doping, the additional electrons become the charge carders and the doped silicon is referred to as negative or n-type silicon. As common in the art, a plus or a minus superscript on an "n" or "p" indicates heavy or light doping, respectively. If a mixture of dopants having opposite conductivity types is used, counterdoping will result, and the conductivity type of the most abundant impurity will prevail.

Conventional CMOS processing formed n-channel (NMOS) and p-channel (PMOS) devices in parallel using many masking steps and requiring excessive processing, thereby increasing costs and reducing device reliability. However, recent developments in split-polysilicon processing provide advantages such as fewer masking steps, reduced processing costs, and improved device reliability. A split-polysilicon process is one where the NMOS transistor gate is patterned in a separate photo lithograph and etch step from the PMOS transistor gate in the CMOS process flow.

Although split-polysilicon processing has provided advantages over conventional CMOS methods, there continues to be room for improvement in split-polysilicon processing techniques because of the consistently high consumer demand for improved and cheaper semiconductor devices. Accordingly, objects of the present invention are to provide an improved split-polysilicon process for forming CMOS devices.

SUMMARY OF THE INVENTION

According to principles of the present invention in its preferred embodiment, NMOS and PMOS devices are formed in a split-polysilicon CMOS process using independent thickness transistor gate spacers, and using a silicon nitride layer as a mask for the p-channel region during an n+ source/drain implant step of the n-channel region. Specifically, the p-channel spacers are formed significantly thicker than the n-channel spacers, thereby reducing the lateral diffusion of p-type dopant species under the p-channel gate and avoiding short channel effects to improve device reliability and performance.

According to further principles of the present invention, p-channel transistor junction depth and lateral diffusion is further reduced by performing an n-channel arsenic source/drain implant before the p-channel source/drain boron implant, although the p-channel transistor gate is etched before the n-channel gate. Moreover, since the p-channel transistor gate is etched before the n-channel gate, the p-channel gate sidewalls are reoxidized as well as the n-channel gate sidewalls for improved gate oxide integrity.

Other objects, advantages, and capabilities of the present invention will become more apparent as the description proceeds.

DETAILED DESCRIPTION OF THE INVENTION

Figure 1:
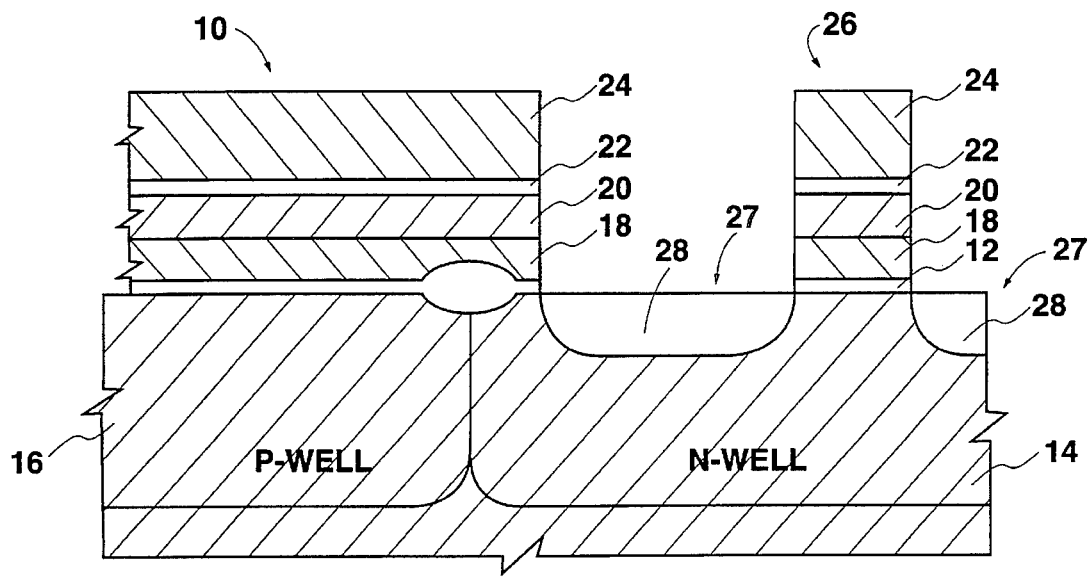
FIG. 1 is a cross-section view of a partially completed CMOS device having a number of conductive and non-conductive transistor gate layers including a first silicon nitride insulating layer, and wherein a PMOS gate is etched prior to an NMOS gate.

FIG. 1 is a cross-section view of a partially completed CMOS device 10 having p-well 16 and n-well 14 prepared for the formation of NMOS and PMOS devices, respectively. In this disclosure, PMOS is used synonymously with p-channel, and NMOS is used synonymously with n-channel to identify the respective complementary FET devices.

A number of conductive and non-conductive transistor gate layers 12, 18, 20, 22, and 24 are shown, and PMOS transistor gate 26 is shown etched in a p-channel region of CMOS device 10. Gate oxide 12 is shown as having been thermally grown over n-well 14 and p-well 16, followed by a deposition of polysilicon layer 18, tungsten silicide ($WSi_x$) or refractory silicide 20, silicon dioxide ($SiO_2$) 22 (referred to hereinafter as silicon oxide or simply oxide), and a first silicon nitride ($Si_3N_4$) insulating layer 24 of about a 500–3000 angstrom (Å) thickness. In the preferred embodiment, silicon nitride is used for various insulating layers, such as layer 24. However, it is understood and obvious that other insulators could also be used, such as silicon oxide or a combination (stacked) layer of silicon nitride and oxide.

After conventional photolithographic processing (i.e., using photoresist), etched p-channel gate 26 is shown having sidewalls adjacent future source and drain areas (active areas) 27. An n-type (phosphorous) implant 28, at a dose of between 1 and $8\times10^{12}$ atoms per $cm^2$, is formed and diffused in active areas 27.

Figure 2:
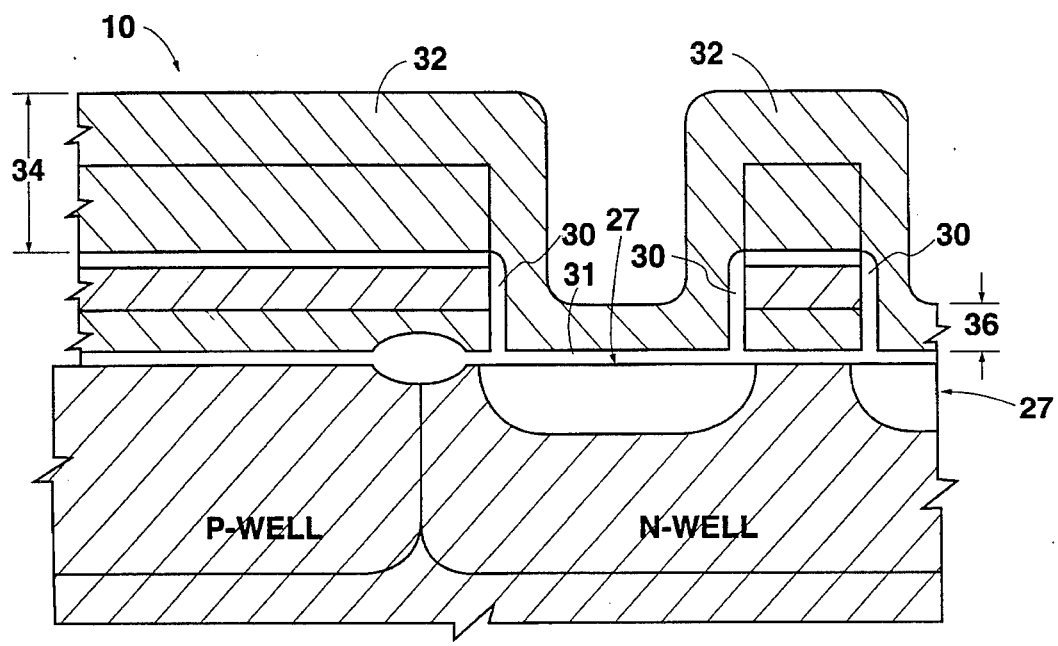
FIG. 2 is a cross-section view of the CMOS device after adding a second insulating layer to form the beginnings of an independent thickness spacer for the PMOS device.

Referring now to FIG. 2, a cross-section view of CMOS device 10 is shown after a resist strip of the photoresist used to form p-channel gate 26, after thermal oxidation (reoxidation at about a conventional 900° C.) to form sidewalls 30 in the p-channel region, and after deposition of a second insulating (silicon nitride) layer 32. Two key advantages are obtained by beginning formation of the PMOS device prior to the NMOS device in this split-polysilicon process: (1) reoxidized sidewalls 30 and gate oxide 31 are able to be formed to provide improved gate oxide integrity for the PMOS device, and (2) an n-type phosphorous halo 28 is formed around future p+ source/drain areas 27 (see FIG. 5). In conventional CMOS split-polysilicon processing, the PMOS device sidewalls are often not reoxidized due to the PMOS device being formed after the NMOS device.

After reoxidation, second insulating layer 32 is deposited over all exposed surface areas to a thickness of about 500–2000 Å to form a foundation for a first spacer which will subsequently become an independent thickness spacer for the PMOS device over n-well 14. Preferably, as with layer 24, insulating layer 32 is silicon nitride. After this deposition, the silicon nitride layer total thickness 34 over p-well area 16 is about 1000–5000 Å, while the n-well active areas 27 nitride thickness 36 is only about 500–2000. This insulating layer thickness 36 acts as a mask for the PMOS device during a later step of ion implantation of the complementary NMOS device.

Figure 3:
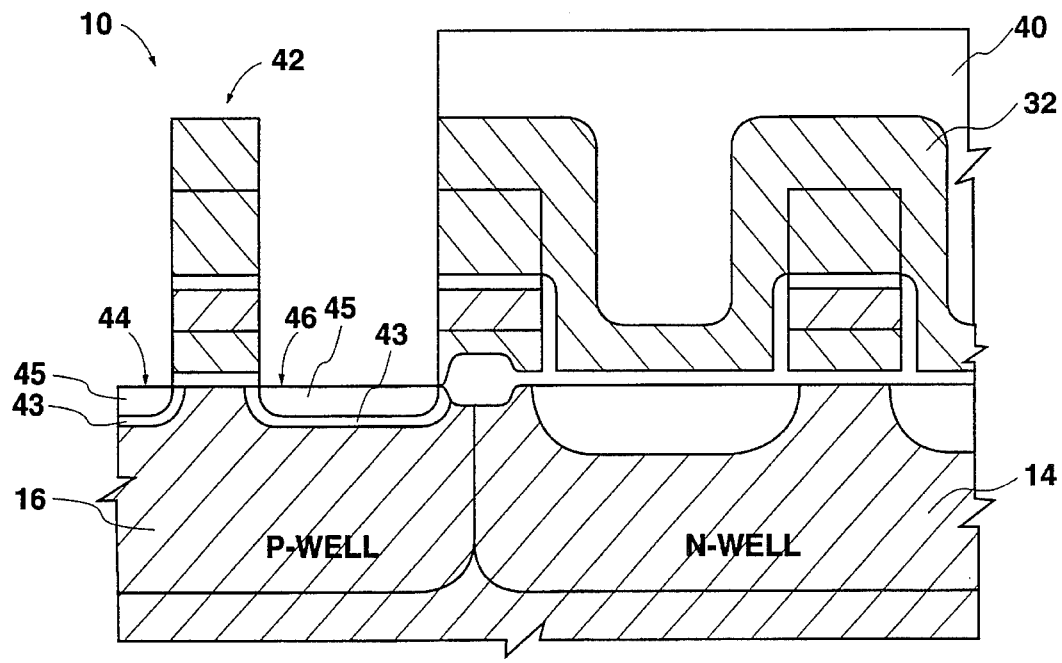
FIG. 3 is a cross-section view of the CMOS device after patterning and etching an NMOS gate while having a photoresist layer over the PMOS device.

FIG. 3 is a cross-section view of CMOS device 10 after patterning and etching n-channel gate 42 over p-well 16. N-channel gate 42 includes sidewalls adjacent future source and drain areas 44 and 46. Photoresist 40 masks the PMOS device over n-well 14 during the etch. Subsequently, a p-type (boron) diffusion 43 is formed in future source and drain areas 44 and 46 in the n-channel region at a dose of between 1 to $9\times10^{12}$ atoms/$cm^2$. Then, an n-type (arsenic) diffusion 45 is formed over p-type diffusion 43 at a dose of about 1 to $3\times13^{13}$ atoms/$cm^2$.

Figure 4:
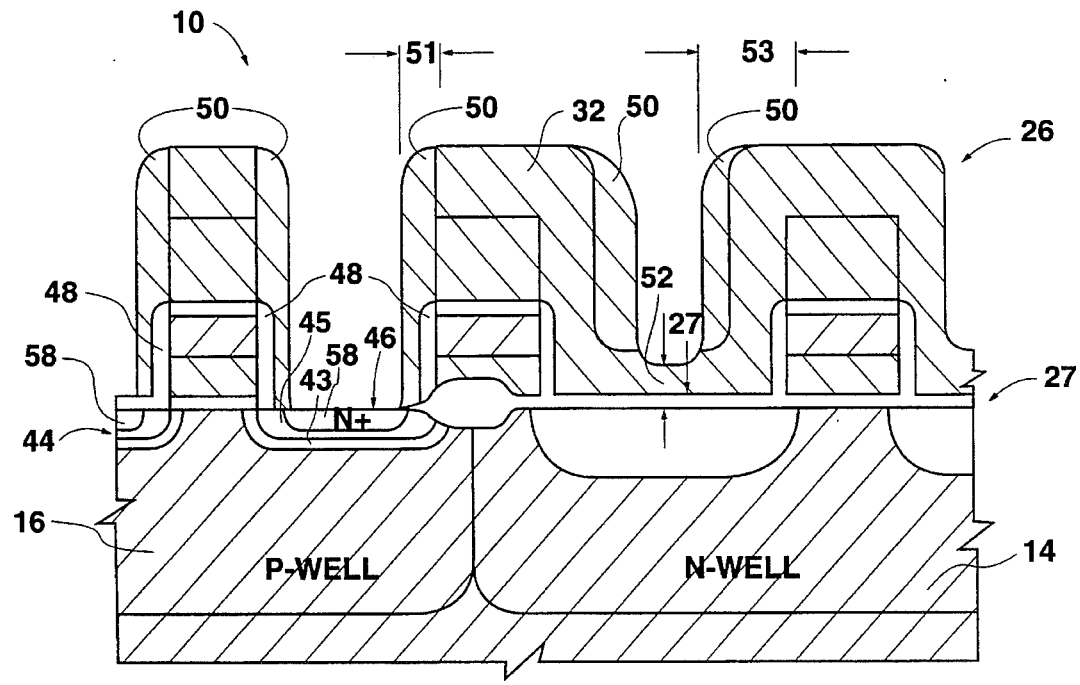
FIG. 4 is a cross-section view of the CMOS device after adding a third insulating layer, and after etching the third layer to form spacers of independent thickness adjacent each PMOS and NMOS gate respectively, and whereby the etching allows for NMOS ion implantation but disallows PMOS implantation due to the remaining second insulating layer acting as a mask over the PMOS region.

Referring now to FIG. 4, a cross-section view of CMOS device 10 is shown after adding a third insulating layer 50 and after etching the third layer to form spacers of independent thickness 51 and 53 adjacent each PMOS and NMOS gate respectively, thereby allowing NMOS ion implantation but disallowing PMOS implantation due to the remaining part 52 of second insulating layer 32 acting as a mask over the PMOS region. Photoresist layer 40 has been removed and gate sidewall reoxidation is formed at 48.

Third silicon nitride insulating layer 50 is originally (not shown) deposited over all exposed surfaces of both the n-well and p-well areas at about 500–2000 521 thickness. Then, as shown, third insulating layer 50 is etched to the substrate without any photomasking step in the n-channel region and forms a first n-channel spacer adjacent the n-channel gate sidewalls with a thickness shown at 51. As mentioned, part of second insulating layer 32 (as shown at 52) acts as a mask over p-channel source and drain areas 27, and is not completely etched when n-channel spacer 51 is etched to the substrate.

As a result of the deposition of third insulating layer 50, a second p-channel spacer is also formed adjacent the first p-channel spacer (the first p-channel spacer defined by second insulating layer 32). As such, first and second p-channel spacers together form an independently thicker overall p-channel spacer (as shown at 53) than the first n-channel spacer (as shown at 51). Namely, over the n-well there is a spacer 50 thickness of about 500–2000 Å plus the thickness of silicon nitride layer 32 of about 500–2000 Å, giving a total thickness of about 1000–4000 Å as at 53. This independent spacer thickness (meaning the thicker spacer 53 over the p-channel device relative to the thinner spacer 51 over the n-channel device) provides improved short channel characteristics for the PMOS FET by reducing lateral p-type diffusion in the p-channel device as described more fully herein during a later ion implantation step.

Next, n-type ions 58, such as arsenic, are implanted in the n-channel region to a dose of about 1 to $5\times10^{15}$ atoms/$cm^2$ thereby forming source and drain areas 44 and 46. This implant completes source 44 and drain 46 for the n-channel (NMOS) device. P-channel active areas 27 are not affected by this n-type implant because of the remaining part of second insulating layer 32, having a thickness 52 of about 1200–2000 Å, acting as a mask over the p-channel region over n-well 14. This 1200–2000 Å insulating ($Si_3N_4$) thickness 52 has eliminated the need for an additional mask step during the heavy n+ arsenic implantation of source and drain areas 44 and 46.

Figure 5:
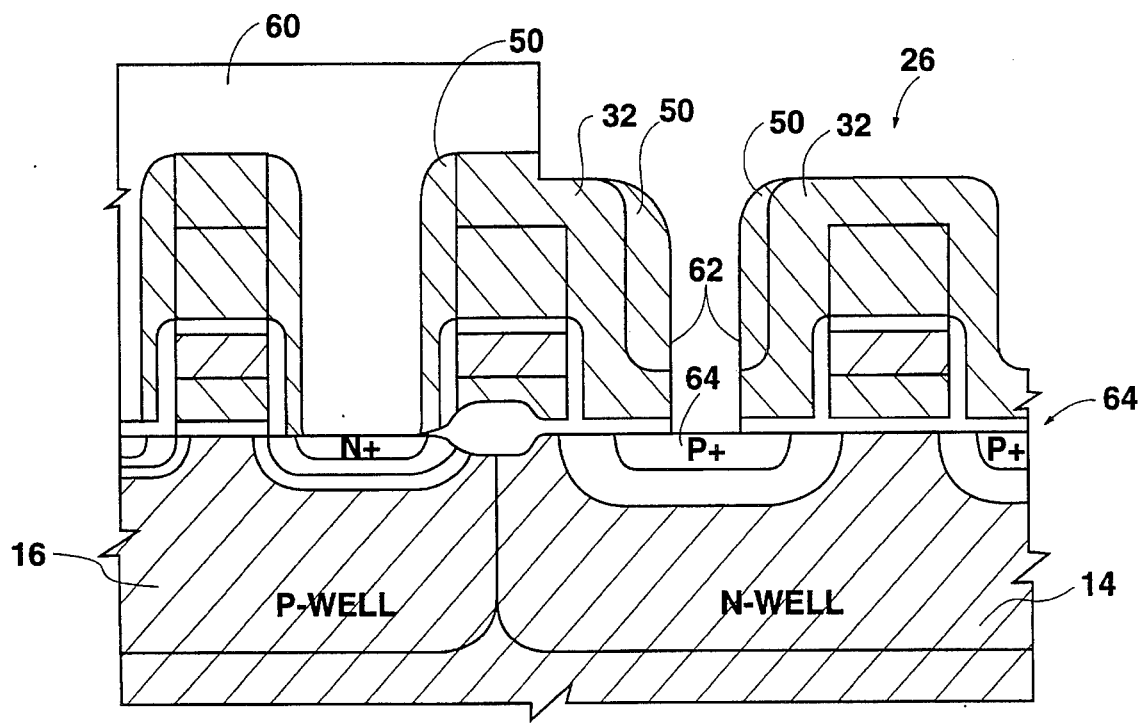
FIG. 5 is a cross-section view of the CMOS device after etching of the remaining second insulating layer over the PMOS region to allow for ion implantation of the PMOS device within its independent thickness spacer region, and while having a photoresist layer over the NMOS region.

Finally, in reference to FIG. 5, the n-channel is masked at 60 while performing the p-channel spacer etch at 62 to remove the remaining part of the 1200–2000 Å nitride spacer layer 52. The p-channel region 62 is etched to the substrate as defined by the independently thicker p-channel spacer that was formed by insulating layers 32 and 50. Then, a p-channel source/drain implantation is performed at 64 by using boron difluoride ($BF_2$). The dose of this boron implant is about $1-5\times10^{15}$ atoms/$cm^2$, forming source and drain areas 64 for p-channel device 26. The CMOS device is then completed by conventional processing at the manufacturer's option.

Several advantages result from this novel split-polysilicon CMOS process. First, the p-channel device gate structure 26 is formed before the n-channel device. Unlike conventional split-polysilicon processing, this allows for the p-channel sidewalls to be reoxidized 30 for improved gate oxide integrity.

Second, since second insulating layer 32 is deposited prior to completion of the p-channel device, it acts as a mask for the p-channel region during subsequent processing and heavy n-type ion implantation in the n-channel region.

Third, n-channel heavy ion implantation is performed prior to p-channel heavy ion implantation. Since boron (p-type) diffuses more than arsenic (n-type), this n-channel implantation prior to p-channel implantation prevents unwanted diffusion of boron in the p-channel which would occur during n-channel processing if the p-channel implantation were performed prior to the n-channel implantation. This sequence of performing the arsenic implant before the boron implant aids in avoiding short channel effects of the p-channel device by reducing the number of drive-in heat treatments on the boron implants since the arsenic implant and drive-in occurs first.

Finally, the use of second insulating layer 32 in connection with third insulating layer 50 forms an independent thickness spacer 62 (having overall dimension 53) in the formation of the p-channel device relative to spacer thickness 51 of the n-channel device. By increasing the sidewall insulating layer thickness in the p-channel source and drain areas, short channel characteristics are reduced in this device, providing improved overall device reliability and, consequently, reduced production costs.

What has been described above are the preferred embodiments for a method of forming CMOS devices using independent thickness spacers in a split-polysilicon process. It is clear that the present invention provides a powerful tool for improving device reliability and reducing processing costs. Moreover, it will be obvious to one of ordinary skill in the art that the present invention is easily implemented utilizing any of a variety of conventional CMOS conductors and nonconductors existing in the art. While the present invention has been described by reference to specific embodiments, it will be apparent that other alternative embodiments and methods of implementation or modification may be employed without departing from the true spirit and scope of the invention.

What is claimed is:

1. A process for forming complementary n-channel and p-channel CMOS devices on a semiconductor wafer substrate having conductive and non conductive layers of transistor gate materials over n-channel and p-channel regions, and having a first insulating layer as a top layer, the process comprising:

(a) forming a p-channel gate structure in the layers of gate materials in the p-channel region;

(b) depositing a second insulating layer over all exposed surfaces, whereby foundational walls for a p-channel spacer are formed adjacent to and on either side of the p-channel gate structure in future active areas of the p-channel region;

(c) masking the p-channel region and forming an n-channel gate structure in the n-channel region;

(d) removing the mask and then depositing a third insulating layer, whereby foundational walls for an n-channel spacer are formed adjacent to and on either side of the n-channel gate structure in future active areas of the n-channel region, and whereby the third insulating layer adds to the p-channel spacer foundational walls to form a thicker overall p-channel spacer in the future active areas of the p-channel region, the thicker spacer being thicker relative to the n-channel spacer;

(e) etching the third insulating layer to the substrate in the future active areas of the n-channel region to form the n-channel spacer adjacent to and on either side of the n-channel gate in the n-channel future active areas, and whereby a part of the second insulating layer remains unetched in the p-channel region over the future p-channel active areas;

(f) implanting n-type ions in the n-channel future active areas to form source and drain areas;

(g) masking the n-channel region and then etching, whereby the part of the second insulating layer in the p-channel future active areas is etched to the substrate in a region defined by the thicker overall p-channel spacer; and, (h) implanting p-type ions in the p-channel future active areas to form source and drain areas defined by the thicker overall p-channel spacer, whereby the source and drain areas have reduced lateral diffusion for avoiding short channel effects.

2. The process of claim 1 wherein the conductive and non-conductive layers of transistor gate materials include gate oxide, polysilicon, refractory silicide, and silicon oxide.

3. The process of claim 1 wherein each insulating layer is selected from the group consisting of silicon oxide, silicon nitride, and a combination of silicon oxide and silicon nitride.

4. The process of claim 1 wherein the first insulating layer is between 500 and 3000 Å, the second insulating layer is between 500 and 2000 Å, and the third insulating layer is between 500 and 2000 Å.

5. The process of claim 1 wherein, after etching of the third insulating layer, the remaining part of the second insulating layer over the future p-channel active areas is about a thickness of between 1200 and 2000 Å.

6. The process of claim 1 wherein the n-type ion implant of step 1(f) is an arsenic ion implant to a dose of about 1 to $5 \times 10^{15}$ atoms per square centimeter.

7. The process of claim 1 wherein the p-type ion implant of step 1(h) is a boron difluoride implant to a dose of about 1 to $5 \times 10^{15}$ atoms per square centimeter.

8. A process for forming complementary n-channel and p-channel metal oxide semiconductor (CMOS) devices on a semiconductor wafer substrate having conductive and non conductive layers of transistor gate materials over n-channel and p-channel regions, the process comprising:

(a) depositing a first insulating layer over all exposed surfaces in the n-channel and p-channel regions;

(b) patterning with a first photoresist layer and then etching a p-channel gate having sidewalls, and source and drain areas in the p-channel region;

(c) forming an n-type diffusion in the p-channel source and drain areas;

(d) stripping the first photoresist layer;

(e) reoxidizing the p-channel gate sidewalls and source and drain areas;

(f) depositing a second insulating layer over all exposed surfaces in the n-channel and p-channel regions, whereby a foundation for a first p-channel spacer is formed adjacent to and on either side of the p-channel gate, and an insulating layer is formed in the p-channel source and drain areas for acting as a mask for a later step;

(g) patterning with a second photoresist layer whereby the p-channel region is masked, and then etching an n-channel gate having sidewalls, and source and drain areas in the n-channel region;

(h) forming a p-type diffusion and then an n-type diffusion over the p-type diffusion in the n-channel source and drain areas;

(i) stripping the second photoresist layer;

(j) reoxidizing the n-channel gate sidewalls and source and drain areas;

(k) depositing a third insulating layer over all exposed surfaces in the n-channel and p-channel regions;

(l) etching the third insulating layer to the substrate in the n-channel region to form a first n-channel spacer adjacent to and on either side of the n-channel gate, and a second p-channel spacer is formed adjacent the first p-channel spacer thereby forming in connection with the first p-channel spacer a thicker overall p-channel spacer than the first n-channel spacer, and whereby a part of the second insulating layer acting as the mask over the p-channel source and drain areas is not substantially etched;

(m) implanting n-type ions in the n-channel source and drain areas, thereby forming an n-channel source and drain;

(n) masking the n-channel region and etching, whereby the part of the second insulating layer in the p-channel source and drain areas that is acting as a mask is etched to the substrate in a region defined by the thicker overall p-channel spacer; and, (o) implanting p-type ions in the p-channel source and drain areas defined by the thicker overall p-channel spacer, thereby forming a p-channel source and drain having reduced lateral diffusion to avoid short channel effects.

9. The process of claim 8 wherein the conductive and non-conductive layers of transistor gate materials include gate oxide, polysilicon, refractory silicide, and silicon oxide.

10. The process of claim 8 wherein each insulating layer is selected from the group consisting of silicon oxide, silicon nitride, and a combination of silicon oxide and silicon nitride.

11. The process of claim 8 wherein the first insulating layer is between 500 and 3000 Å, the second insulating layer is between 500 and 2000 Å, and the third insulating layer is between 500 and 2000 Å.

12. The process of claim 8 wherein the n-type diffusion of step 8(c) in the p-channel source and drain areas is formed by a phosphorus ion implant to a dose of between 1 and $8\times10^{12}$ atoms per square centimeter, thereby forming a lightly-doped p-channel source and drain.

13. The process of claim 8 wherein the p-type diffusion of step 8(h) in the n-channel source and drain areas is formed by a boron implant to a dose of 1 to $9\times10^{12}$ atoms per square centimeter, and wherein the n-type diffusion over the p-type diffusion in the n-channel source and drain is formed by an arsenic implant to a dose of 1 to $3\times10^{13}$ atoms per square centimeter, thereby forming a lightly-doped n-channel source and drain.

14. The process of claim 8 wherein, after etching of the third insulating layer, the part of the second insulating layer acting as the mask over the p-channel source and drain areas is about a thickness of between 1200 and 2000 Å.

15. The process of claim 8 wherein the n-type ion implant of step 8(m) is an arsenic ion implant to a dose of 1 to $5\times10^{15}$ atoms per square centimeter.

16. The process of claim 8 wherein the p-type implant of step 8(o) is a boron difluoride implant to a dose of 1 to $5\times10^{15}$ atoms per square centimeter.

\* \* \* \* \*